United States Patent
Reznicek et al.

(10) Patent No.: US 11,075,334 B2
(45) Date of Patent: Jul. 27, 2021

(54) SPIN-ORBIT-TORQUE MAGNETO-RESISTIVE RANDOM ACCESS MEMORY WITH STEPPED BOTTOM ELECTRODE

(71) Applicant: International Business Machines Corporation, Armonk, NY (US)

(72) Inventors: Alexander Reznicek, Troy, NY (US); Ruilong Xie, Niskayuna, NY (US); Heng Wu, Guilderland, NY (US); Lan Yu, Voorheesville, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 16/692,766

(22) Filed: Nov. 22, 2019

(65) Prior Publication Data

US 2021/0159390 A1    May 27, 2021

(51) Int. Cl.
*H01L 43/02* (2006.01)
*H01L 43/12* (2006.01)
*H01L 27/22* (2006.01)

(52) U.S. Cl.
CPC ............ *H01L 43/02* (2013.01); *H01L 27/222* (2013.01); *H01L 43/12* (2013.01)

(58) Field of Classification Search
CPC ........ H01L 43/02; H01L 27/222; H01L 43/12
See application file for complete search history.

(56) References Cited

U.S. PATENT DOCUMENTS

| 8,574,928 | B2 | 11/2013 | Satoh |
| 8,587,043 | B2 | 11/2013 | Natori et al. |
| 9,768,229 | B2 | 9/2017 | Braganca et al. |
| 9,830,966 | B2 | 11/2017 | Mihajlovic et al. |
| 9,830,968 | B2 | 11/2017 | Shimomura et al. |
| 9,837,602 | B2 | 12/2017 | Braganca |
| 2017/0365777 | A1 | 12/2017 | Braganca |
| 2019/0058112 | A1 | 2/2019 | Chen et al. |

(Continued)

OTHER PUBLICATIONS

Garello, et al., "SOT-MRAM 300mm integration for low power and ultrafast embedded memories", 2018 Symposium on VLSI Circuits Digest of Technical Papers, pp. 81-82.

(Continued)

*Primary Examiner* — Marc Anthony Armand
(74) *Attorney, Agent, or Firm* — Michael A. Petrocelli

(57) ABSTRACT

A memory structure, and a method for forming the same, includes a spin-orbit-torque electrode within a dielectric layer located above a substrate. The spin-orbit-torque electrode including a first conductive material, and a spin-orbit torque via is directly above the spin-orbit-torque electrode that includes a second conductive material. A magnetic tunnel junction pillar is directly above the spin-orbit torque via, and the spin-orbit-torque via contacting a center of a bottom surface of the magnetic-tunnel-junction pillar. A third conductive material is positioned directly below the bottom surface of the magnetic tunnel junction pillar on opposite sides of the spin-orbit torque via and directly above the spin-orbit-torque electrode. The third conductive material, the spin-orbit torque electrode and the spin-orbit torque via form a bottom spin-orbit torque electrode of the magnetic tunnel junction pillar.

20 Claims, 7 Drawing Sheets

(56) References Cited

U.S. PATENT DOCUMENTS

2019/0080738 A1   3/2019  Choi et al.
2020/0136019 A1*  4/2020  Lin .................. G11C 11/161
2020/0194666 A1*  6/2020  Araki ................ H01L 43/06

OTHER PUBLICATIONS

Bahaman et al., "Pulse-Width and Temperature Effect on the Switching Behavior of an Etch-Stop-on-MgO-Barrier Spin-Orbit Torque MRAM Cell," IEEE Electron Device Letters, vol. 39, No. 9, 2018, pp. 1306-1309.

* cited by examiner

SPIN-ORBIT-TORQUE MAGNETO-RESISTIVE RANDOM ACCESS MEMORY WITH STEPPED BOTTOM ELECTRODE

BACKGROUND

The present invention generally relates to the field of magnetic storage devices, and more particularly to spin-orbit-torque (SOT) magneto-resistive random access memory (MRAM) devices.

MRAM is a non-volatile random-access memory technology. Unlike conventional RAM, data in MRAM devices is not stored as electric charge or current flows. Instead, data is stored by magnetic storage elements. MRAM devices include cells or elements having a magnetically hard layer (i.e., a "reference" layer) and a magnetically soft layer (i.e., the "free" layer). Writing to MRAM is performed by passing current through current leads that are formed on either side of each memory element in order to create a local induced magnetic field, which sets the direction of the soft layer magnetization.

Spin-transfer torque (STT) MRAM devices are two terminal devices similar to conventional MRAM devices, except that the write current paths pass through the magnetic layers of each memory element. The free layer is set via the spin transfer torque from the spin-polarized current passing through the reference magnetic layer. In an STT-MRAM device, the spin of the electrons is flipped using a spin-polarized current. This effect can be achieved in a magnetic tunnel junction (MTJ) or a spin-valve. The spin-polarized current is created by passing a current through a thin magnetic layer, and then directed into a thinner magnetic layer which transfers the angular momentum to the thin layer which changes its spin. A drawback of this configuration is that having the same write/read path can impaired read reliability of STT-MRAM devices. Additionally, the write current in STT-MRAM devices can also impose stress on the MTJ, leading to time dependent degradation of the memory cell.

Spin-orbit torque (SOT) MRAM technology have the potential to challenge STT-MRAM, as it is a faster and more efficient memory technology with better device reliability due to separate write and read paths. Specifically, in SOT-MRAM devices the read and write paths are independent, i.e., the write current does not pass through the reference and free magnetic layers. Because of this feature, SOT-MRAM devices may exhibit better endurance and read stability. However, back-sputtering of heavy metal particles during MTJ ion bean etch may negatively impact the yield of SOT-MRAM devices. Additionally, SOT-MRAM architecture requires a bottom heavy metal SOT plate featuring high spin orbital torque efficiency to be equal or larger than the MTJ cell in order to induce spin current into the free layer of the MTJ. Therefore, improved designs and techniques for formation of SOT-MRAM devices would be desirable.

SUMMARY

Shortcomings of the prior art are overcome and additional advantages are provided through the provision of a method of forming a memory structure that includes forming a sacrificial layer above a spin-orbit-torque electrode including a first conductive material, the spin-orbit torque electrode is located above a substrate, forming a trench in the sacrificial layer, the trench extends until a central portion of a top surface of the spin-orbit torque electrode, filling the trench with a second conductive material to form a spin-orbit torque via, and forming a magnetic tunnel junction pillar directly above the sacrificial layer and spin-orbit torque via, the spin-orbit-torque via contacting a center of a bottom surface of the magnetic-tunnel-junction pillar, a first portion of the sacrificial layer perpendicular to the substrate remains on sidewalls of the spin-orbit via below the magnetic tunnel junction pillar and a second portion of the sacrificial layer parallel to the substrate remains above the spin-orbit torque electrode after formation of the magnetic tunnel junction pillar.

Another embodiment of the present disclosure provides a memory structure that includes a spin-orbit-torque electrode within a dielectric layer located above a substrate, the spin-orbit-torque electrode including a first conductive material, a spin-orbit torque via directly above the spin-orbit-torque electrode, the spin-orbit torque via including a second conductive material, a magnetic tunnel junction pillar directly above the spin-orbit torque via, the spin-orbit-torque via contacting a center of a bottom surface of the magnetic-tunnel-junction pillar, and a third conductive material positioned directly below a bottom surface of the magnetic tunnel junction pillar on opposite sides of the spin-orbit torque via and directly above the spin-orbit-torque electrode, the third conductive material, the spin-orbit torque electrode and the spin-orbit torque via include a bottom spin-orbit torque electrode of the magnetic tunnel junction pillar.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
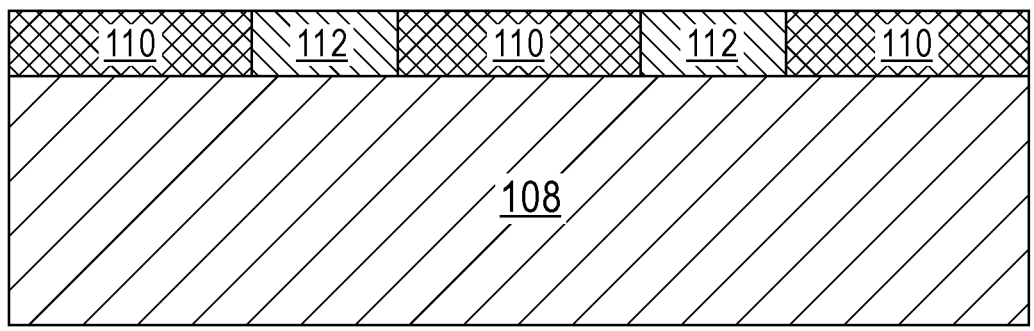
FIG. 1 is a cross-sectional view of a memory device at an intermediate step during a back-end-of-the-line (BEOL) integration process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention generally relates to the field of magnetic storage devices, and more particularly to spin-orbit-torque (SOT) magneto-resistive random access memory (MRAM) devices. The proposed embodiments provide a method and associated structure for fabricating a MRAM-SOT device with a stepped-shaped bottom SOT electrode that substantially matches a size of an MTJ pillar while exhibiting a larger bottom portion that further improves spin-inducing capabilities. Additionally, the proposed embodiments may prevent back-sputtering of heavy metals during etching of the MTJ pillar. A way to form the stepped-shaped bottom SOT electrode includes forming a sacrificial layer above a SOT electrode, forming a SOT via within the sacrificial layer, forming an MTJ pillar above the SOT via followed by sidewall spacers, removing the sacrificial layer, and filling the recesses formed after removing the sacrificial layer with a conductive material. An embodiment by which the stepped-shaped bottom SOT electrode can be formed is described in detailed below by referring to the accompanying drawings in FIGS. 1-9.

Referring now to FIG. 1, a memory device 100 at an intermediate step during a back-end-of-the-line (BEOL) integration process is shown, according to an embodiment of the present disclosure. In this embodiment, the memory device 100 is a SOT-MRAM device. The memory device 100 includes a spin-orbit torque (SOT) electrode 110 formed in a dielectric layer 112 located above a simplistically depicted substrate 108. As known by those skilled in the art, the substrate 108 may include one or more metal-oxide-semiconductor field-effect transistors (not shown).

The dielectric layer 112 may include, for example, a low-k dielectric material having a dielectric constant, k, in the range of approximately 2.0 to approximately 2.7, which may be deposited directly above the substrate 108 by any suitable deposition process such as, for example, chemical vapor deposition (CVD). A thickness of the dielectric layer 102 may vary from approximately 10 nm to approximately 60 nm and ranges there between.

The SOT electrode 110 may be made of a first conductive material including a metal with high spin orbit coupling and/or metals that exhibit spin dependent scattering. According to an embodiment, the first conductive material forming the SOT electrode 110 may include tantalum, tungsten, platinum, gadolinium, and the like. In some embodiments, the SOT electrode 110 may consist of a multilayer stack including one or more layers of metals. In such embodiments, a metal layer exhibiting the greatest spin-orbit coupling coefficient or the greatest spin dependent scattering strength is disposed directly adjacent to a subsequently formed magnetic tunnel junction (MTJ) pillar. The process of forming the SOT electrode 110 may typically include etching the dielectric layer 112 to form trenches in which the SOT material can be deposited.

In an exemplary embodiment, the SOT electrode 110 may have a (vertical) thickness varying between 10 nm to approximately 60 nm, although other thicknesses above or below this range may be used as desired for a particular application. As depicted in the figure, a top surface of the SOT electrode 110 is substantially co-planar with the dielectric layer 102. It should be noted that, for functionality of the memory device 100, a length or horizontal thickness of the SOT electrode 110 may be substantially equal or larger than a length or horizontal thickness of a bottom portion of a subsequently formed MTJ pillar, as will be described below.

Figure 2:
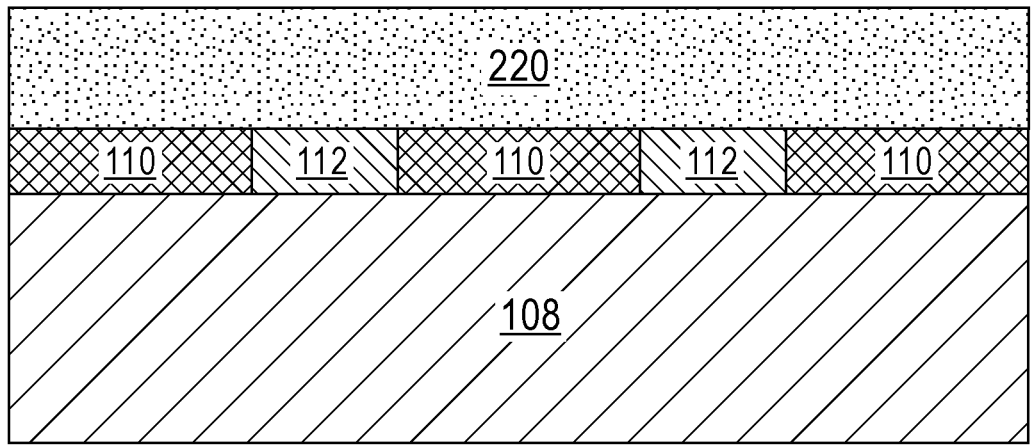
FIG. 2 is a cross-sectional view of the memory device depicting the deposition of a sacrificial layer, according to an embodiment of the present disclosure.

Referring now to FIG. 2, a cross-sectional view of the memory device 100 depicting the deposition of a sacrificial layer 220 is shown, according to an embodiment of the present disclosure. The sacrificial layer 220 can be formed by depositing a layer of a sacrificial material including, for example, amorphous silicon (a-Si), amorphous silicon germanium (a-SiGe), an oxide material, and the like. By forming the sacrificial layer 220, back sputtering of heavy metals from the SOT electrode 110 can be prevented during subsequent processing steps.

The sacrificial layer 220 may be deposited by physical vapor deposition (PVD) or CVD processes. In an exemplary embodiment, the sacrificial layer may have a (vertical) thickness varying between approximately 10 nm to approximately 60 nm, although other thicknesses above or below this range may be used as desired for a particular application.

Figure 3:
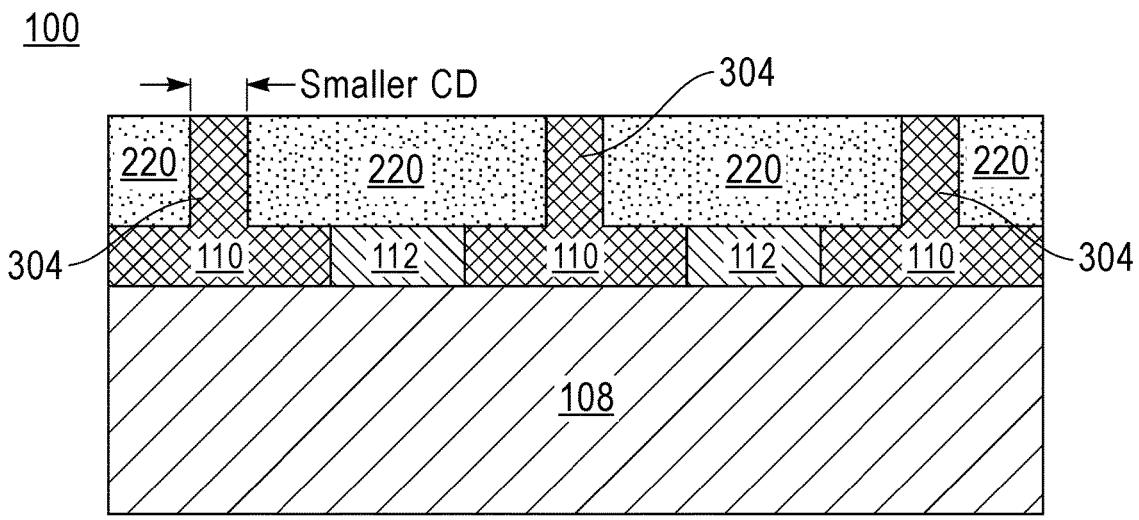
FIG. 3 is a cross-sectional view of the memory device depicting the formation of a SOT via, according to an embodiment of the present disclosure.
Figure 5:
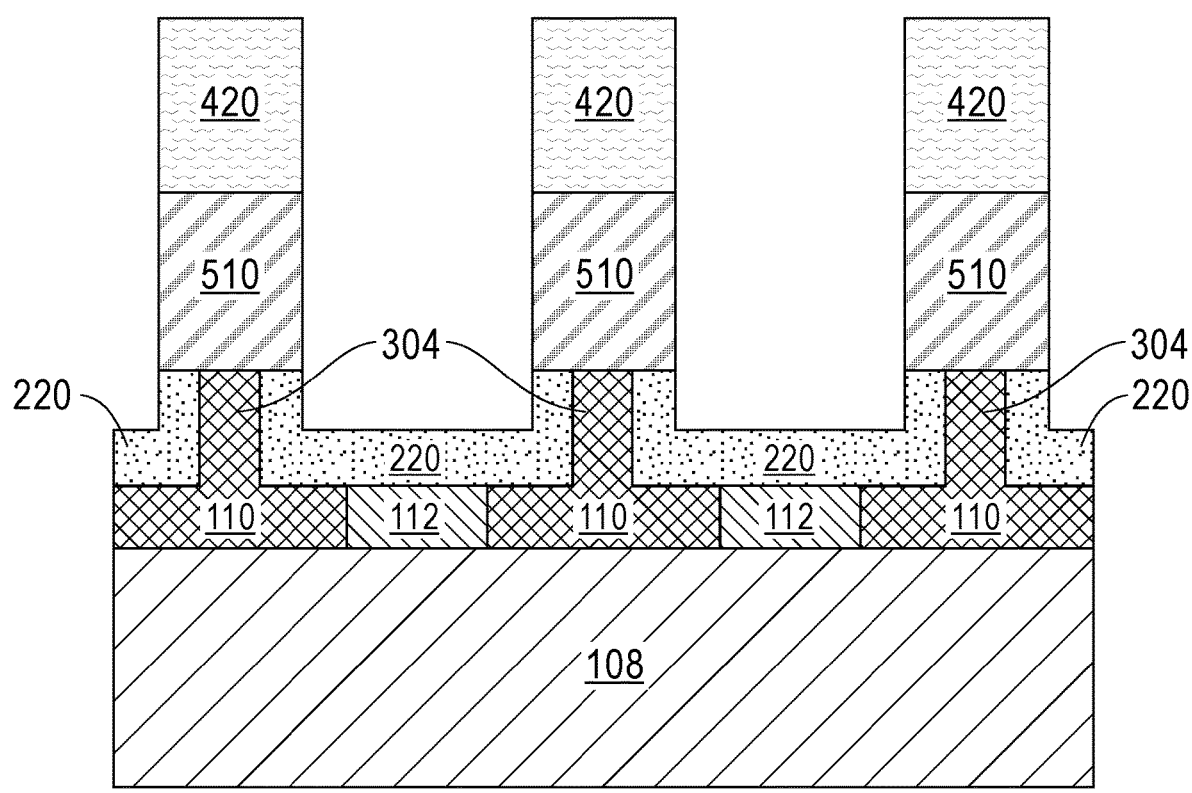
FIG. 5 is a cross-sectional view of the memory device depicting patterning of the MRAM stack followed by an ion beam etch process, according to an embodiment of the present disclosure.

Referring now to FIG. 3, a cross-sectional view of the memory device 100 depicting the formation of a SOT via 304 in the sacrificial layer 220 is shown, according to an embodiment of the present disclosure. At this step of the manufacturing process, trenches (not shown) are formed in the sacrificial layer 220 using any etching technique known in the art. The trenches (not shown) may extend until a central portion of a top surface of the SOT electrode 110. Following the formation of the trenches (not shown) in the sacrificial layer 220, a second conductive material similar to the first conductive material forming the SOT electrode 110 may be deposited within the trenches to form the SOT via 304. The SOT via 304 may connect the SOT electrode 110 to a subsequently formed MTJ pillar (FIG. 5). As shown in the figure, the SOT via 304 is located approximately in the central portion of the SOT electrode 110.

According to an embodiment, the SOT via 304 and the SOT electrode 110 include the same conductive material with analogous high spin orbit coupling and/or spin dependent scattering properties. The second conductive material filling the SOT via 304 may be deposited by any suitable deposition method known in the art including, for example, atomic layer deposition (ALD), CVD, or selective metal growth from (bottom) SOT electrode 110. After forming the SOT via 304, a planarization process may be conducted on the memory device 100 to remove excess second conductive material and achieve the flat and smooth top surface depicted in the figure.

As can be appreciated in FIG. 3, the SOT via 304 exhibits a smaller critical dimension (CD) than the SOT electrode 110. The smaller CD of the SOT via 304 may help preventing metal back sputtering during subsequent MTJ stack patterning process, as will be explained in detailed below. It should be noted that the SOT via 304 is surrounded by the sacrificial layer 220. As described above, the presence of the sacrificial layer 220, together with the smaller CD of the SOT via 304, may prevent back sputtering of heavy metals from the SOT electrode 110 and SOT via 304 during patterning of the MTJ pillar (FIG. 5).

Figure 4:
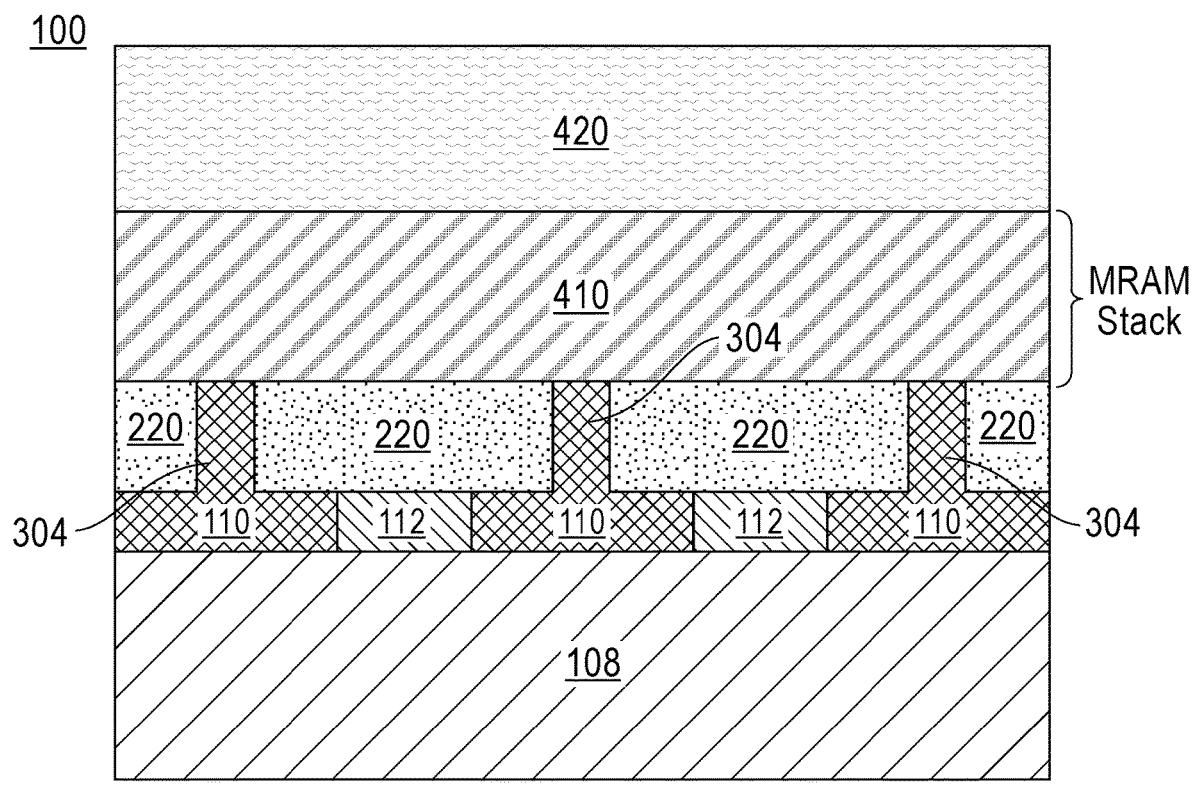
FIG. 4 is a cross-sectional view of the memory device depicting forming an MRAM stack followed by deposition of a hard mask layer, according to an embodiment of the present disclosure.

Referring now to FIG. 4, a cross-sectional view of the memory device 100 depicting the formation of an MRAM stack 410 followed by the deposition of a hard mask layer 420 is shown, according to an embodiment of the present disclosure. In this embodiment, the simplistically depicted MRAM stack 410 is disposed above top surfaces of the sacrificial layer 220 and SOT via 304. As known by those skilled in the art, forming the MRAM stack 410 typically involves a sequence of processing steps during which numerous layers of metals and dielectrics are deposited and then patterned to form an MTJ pillar 510 (FIG. 5). The MRAM stack usually includes free and pinned layers (not shown) of the memory device 100, sandwiched around one or more dielectric layers functioning as the tunnel junction for the MTJ pillar 510 (FIG. 5).

According to an embodiment, the hard mask layer 420 may include a dielectric material such as silicon dioxide, silicon nitride, silicon carbide, and the like deposited by any suitable deposition method known in the art. In some embodiments, a top layer of the MRAM stack 410 may act as both a hard mask for etching the MRAM stack and as an interlayer conductor channel. A (vertical) thickness of the hard mask layer 420 may vary between approximately 10 nm to approximately 100 nm, although other thicknesses above or below this range may be used as desired for a particular application.

Referring now to FIG. 5, a cross-sectional view of the memory device 100 depicting patterning of the MRAM stack 410 (FIG. 4) followed by an ion beam etch process is shown, according to an embodiment of the present disclosure. In this embodiment, a patterned MTJ pillar 510 (hereinafter "MTJ pillar") formed from the MRAM stack 410 of FIG. 4 can be appreciated. The MTJ pillar 510 is disposed above the SOT via 304 in a way such that a top surface of the SOT via 304 contacts a central portion of a bottom surface of the MTJ pillar 510.

The process of patterning the MRAM stack 410 (FIG. 4) to form the MTJ pillar 510 consists of steps well-known in the art, which generally include forming a pattern on a photoresist layer (not shown) that is transferred to the hard mask layer 420 and used to pattern the underlying MTJ pillar 510 via any suitable etching technique. In an exemplary embodiment, an ion beam etch (IBE) technique may be used to pattern the MTJ pillar 510. As described above, the sacrificial layer 220 prevents back sputtering of heavy metals during the ion beam etch conducted to form the MTJ pillar 510.

Figure 6:
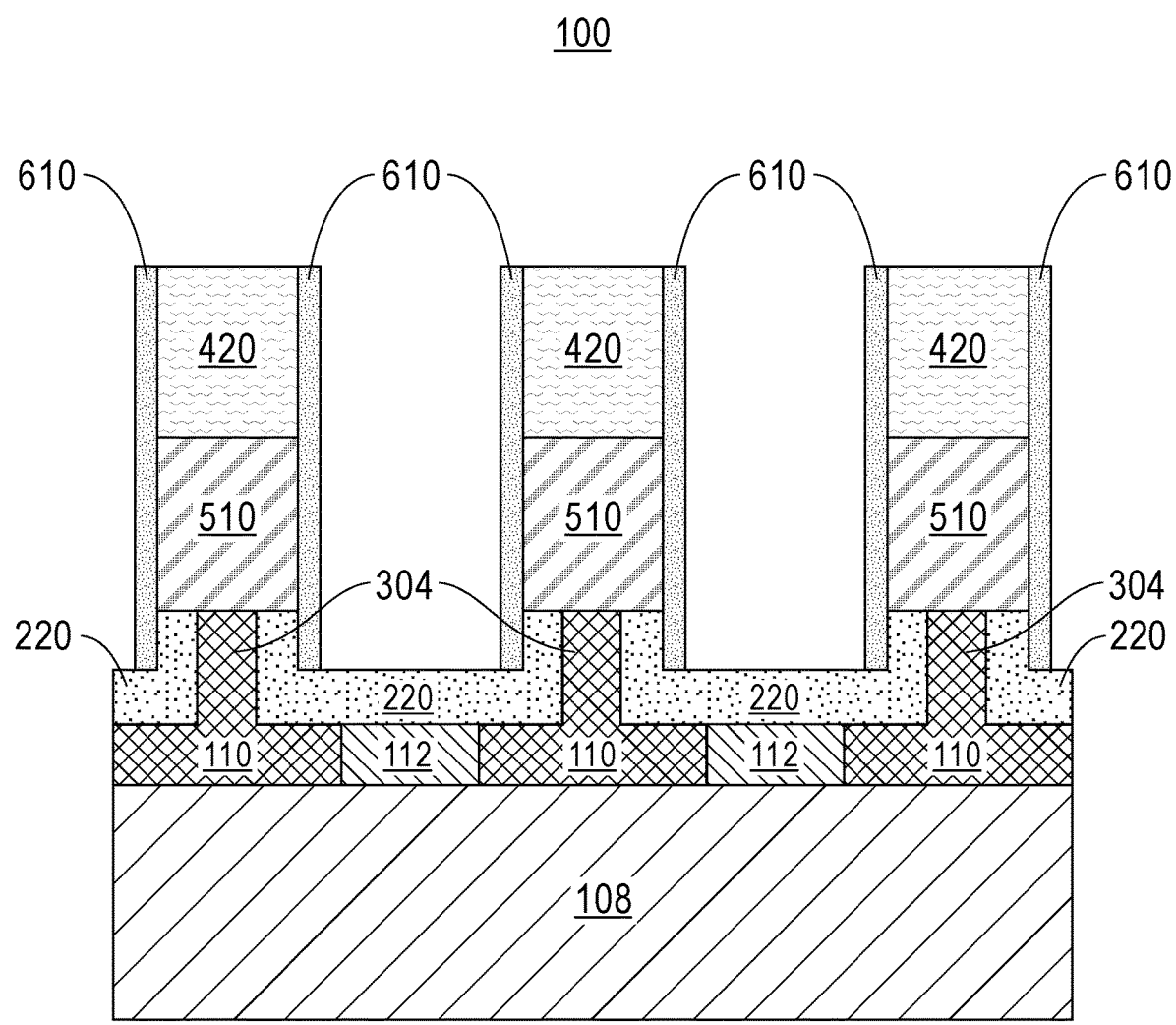
FIG. 6 is a cross-sectional view of the memory device depicting the formation of sidewall spacers, according to an embodiment of the present disclosure.

Referring now to FIG. 6, a cross-sectional view of the memory device 100 depicting the formation of sidewall spacers 610 is shown, according to an embodiment of the present disclosure. The sidewall spacers 610 may protect the MTJ pillar 510 during subsequent processing steps. The sidewall spacers 610 may be formed along opposite sidewalls of the MTJ pillar 510, hard mask layer 420, and sacrificial layer 220, as illustrated in the figure. It should be noted that, a bottom surface of the sidewall spacers 610 contacts a top surface of the sacrificial layer 220 that is parallel to the substrate 108.

The sidewall spacers 610 may be made from an insulator material such as an oxide, nitride, oxynitride, silicon carbon oxynitride, silicon boron oxynitride, low-k dielectric, or any combination thereof. Standard deposition and etching techniques may be used to form the sidewall spacers 610. As known by those skilled in the art, the deposited insulator material is removed from all horizontal surfaces of the memory device 100 using, for example, an anisotropic etch.

According to an embodiment, a (horizontal) thickness of the sidewall spacers 610 may vary between approximately 6 nm to approximately 40 nm, although other thicknesses above or below this range may be used as desired for a particular application.

Figure 7:
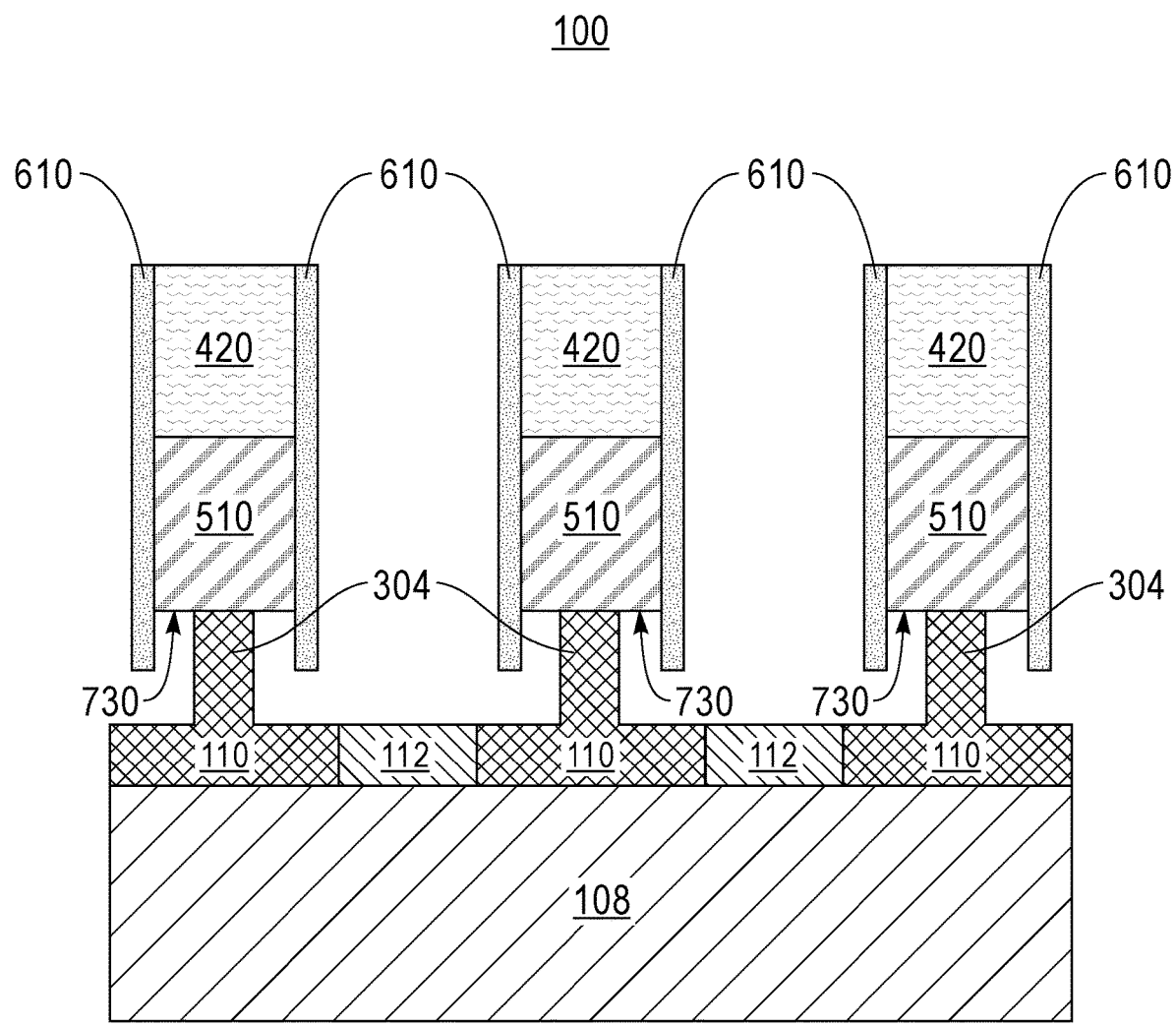
FIG. 7 is a cross-sectional view of the memory device depicting removing the sacrificial layer, according to an embodiment of the present disclosure.

Referring now to FIG. 7, a cross-sectional view of the memory device 100 depicting removing the sacrificial layer 220 (FIG. 6) is shown, according to an embodiment of the present disclosure. Any known etching technique can be used to remove the sacrificial layer 220. In embodiments in which the sacrificial layer 220 includes a-SiGe, a vapor phase HCl etch can be used to remove the sacrificial layer 220.

As depicted in the figure, the removal of the sacrificial layer 220 creates recesses 730 between a bottom surface of the MTJ pillar 510, opposite sidewalls of the SOT via 304, and the bottom portion of the sidewall spacers 610. It should be noted that the formation of the sacrificial layer 220 during earlier processing steps allowed the formation of the recesses 730 in the indicated areas of the memory device 100 after its removal. This may guarantee that a subsequently deposited third (SOT) conductive material within the recesses, together with the SOT via 304, substantially covers the bottom surface of the MTJ pillar 510, as will be described in detail below.

Figure 8:
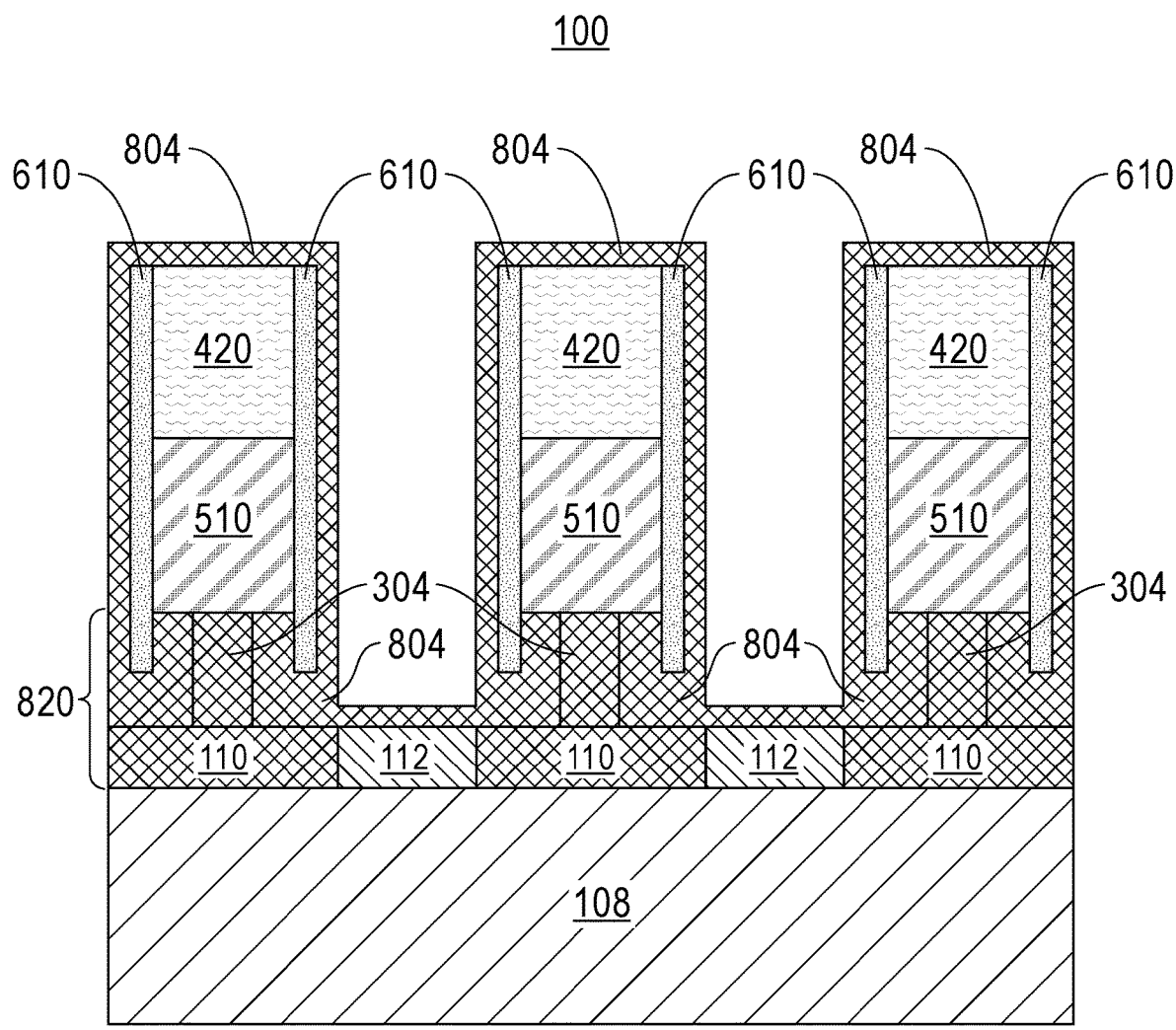
FIG. 8 is a cross-sectional view of the memory device depicting conformally depositing a conductive material, according to an embodiment of the present disclosure.

Referring now to FIG. 8, a cross-sectional view of the memory device 100 depicting conformally depositing a third conductive material 804 is shown, according to an embodiment of the present disclosure. The third conductive material 804 may be conformally deposited on the memory device 100 using standard deposition methods. In an embodiment, a conformal ALD process can be used to deposit the third conductive material 804. The third conductive material 804 substantially fills the recesses 730 (FIG. 7), as depicted in the figure.

The third conductive material 804 may include the same conductive material forming the SOT via 304 and the SOT electrode 110 having analogous high spin orbit coupling and/or spin dependent scattering properties. According to an embodiment, together the SOT electrode 110, SOT via 304 and bottom portions of the third conductive material 804 form a bottom SOT electrode 820 of the MTJ pillar 510, as will be described in detail below.

Figure 9:
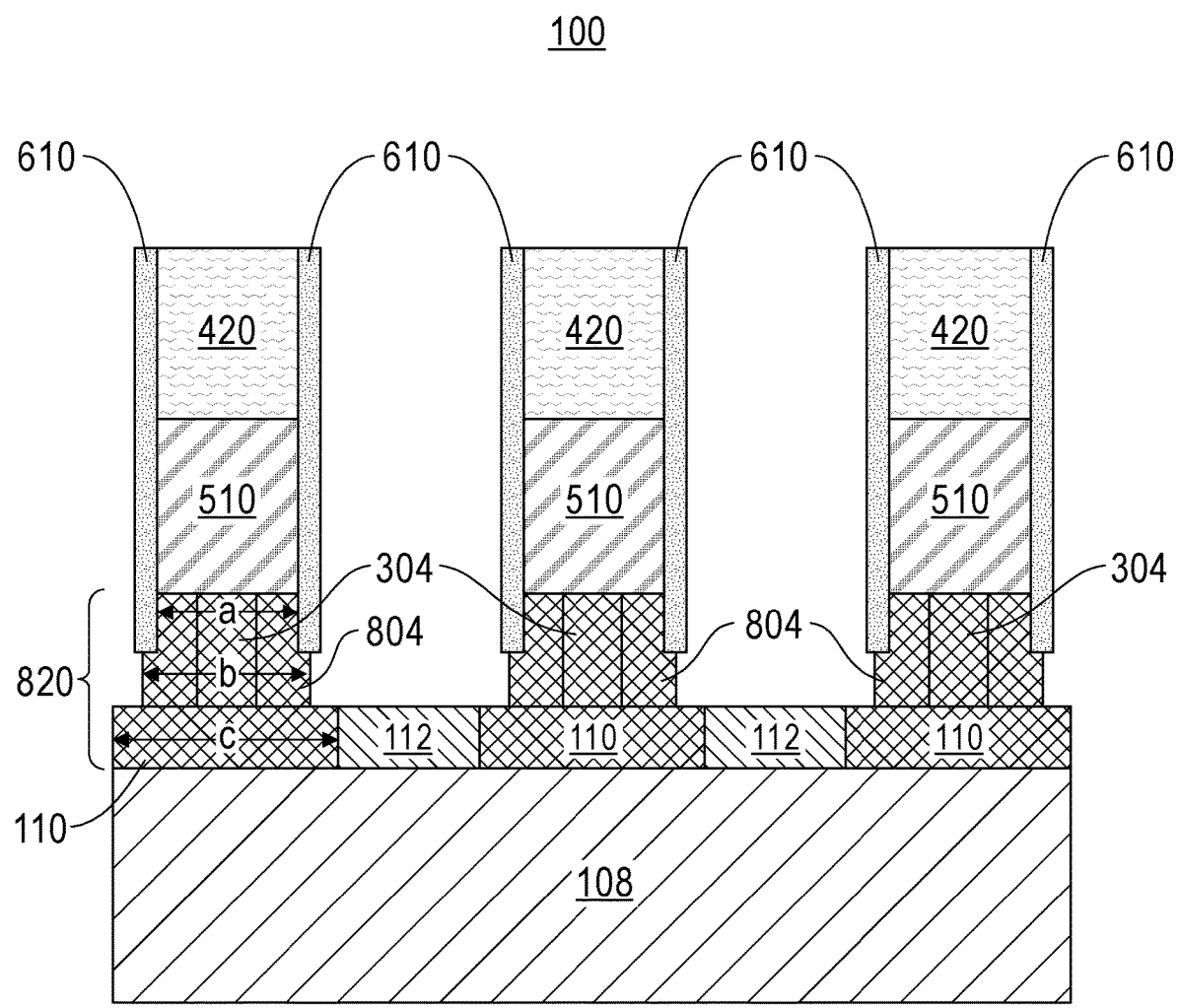
FIG. 9 is a cross-sectional view of the memory device depicting etching the conductive material from upper portions of the memory device, according to an embodiment of the present disclosure.

Referring now to FIG. 9, a cross-sectional view of the memory device 100 depicting removing the third conductive material 804 from upper portions of the memory device 100 is shown, according to an embodiment of the present disclosure. At this step of the manufacturing process, an isotropic etch is conducted on the memory device 100 to remove portions of the third conductive material 804 located parallel to the substrate 108 and along the sidewalls spacers 610. The etching process may continue to further etch portions of the third conductive material 804 located between a bottom surface of the sidewall spacers 610 and the top surface of the SOT electrode 110. As described above, the SOT electrode 110, SOT via 304 and remaining portions of the third conductive material 804 form the bottom SOT electrode 820 of the MTJ pillar 510.

According to an embodiment, etching of the third conductive material 804 is performed until a middle length or horizontal thickness b of the bottom SOT electrode 820 is less than a bottom length or horizontal thickness c but larger than a top length or horizontal thickness a of the bottom SOT electrode 820. Stated differently, the third conductive material 804 is etched until a length b of a middle region of the bottom SOT electrode 820 is less than a length c of a bottom region but larger than a length a of a top region of the bottom SOT electrode 820. As shown in the figure, the top region (i.e., region of length a) of the bottom SOT electrode 820 is covered by the sidewall spacers 610, and the bottom surface of the sidewalls spacers 610 contacts with or lands on the middle region (i.e., region of length b) of the SOT electrode 820. As a result, the bottom SOT electrode 820 may exhibit a stepped shape as illustrated in the figure. The stepped shape of the bottom SOT electrode 820 allows for a top portion of the bottom SOT electrode 820 to match a size of the MTJ pillar 510 while providing a SOT electrode of larger size below the MTJ pillar 510 to effectively induce spin.

Therefore, by forming the sacrificial layer 220 on the memory device 100 prior to the patterning of the MTJ pillar 510 and formation of the sidewalls spacers 610, back sputtering of heavy metals can be prevented during ion bean etch of the MTJ pillar 510. Additionally, after removal of the sacrificial layer 220, recesses below the MTJ pillar 510 and between sidewall spacers 610 can be filled with the third conductive material 804 providing full coverage of the bottom surface of the MTJ pillar 510 which enhances spin-inducing capabilities. Finally, the stepped shape of the bottom SOT-electrode 804 may further improve spin-inducing capabilities and yield of the memory device 100.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a memory structure in a semiconductor device, comprising:
    forming a sacrificial layer above a spin-orbit-torque electrode comprising a first conductive material, the spin-orbit torque electrode is located within a dielectric layer above a substrate;
    forming a trench in the sacrificial layer, the trench extends until a central portion of a top surface of the spin-orbit torque electrode;
    filling the trench with a second conductive material to form a spin-orbit torque via; and
    forming a magnetic tunnel junction pillar directly above the sacrificial layer and the spin-orbit torque via, the spin-orbit-torque via contacting a center of a bottom surface of the magnetic-tunnel-junction pillar, wherein a first portion of the sacrificial layer perpendicular to the substrate remains on sidewalls of the spin-orbit torque via below the magnetic tunnel junction pillar and a second portion of the sacrificial layer parallel to the substrate remains above the spin-orbit torque electrode.

2. The method of claim 1, further comprising:
    forming sidewall spacers along opposite sides of the magnetic tunnel junction pillar and the portion of the sacrificial layer perpendicular to the substrate.

3. The method of claim 2, further comprising:
    removing the sacrificial layer, wherein removing the sacrificial layer creates a recess below the bottom surface of the magnetic tunnel junction pillar, between the sidewall spacers and the spin-orbit torque via.

4. The method of claim 3, further comprising:
    filling the recess with a third conductive material, the third conductive material substantially fills the recess and covers the bottom surface of the magnetic tunnel junction pillar, wherein the third conductive material, the spin-orbit torque electrode and the spin-orbit torque via form a bottom spin-orbit torque electrode of the magnetic tunnel junction pillar.

5. The method of claim 4, further comprising:
    etching the third conductive material until a length of a middle region of the bottom spin-orbit torque electrode is less than a length of a bottom region but larger than a length of a top region of the bottom spin-orbit torque electrode.

6. The method of claim 5, wherein the top region of the bottom spin-orbit torque electrode is covered by the sidewall spacers, and a bottom surface of the sidewalls spacers lands on the middle region of the bottom spin-orbit torque electrode.

7. The method of claim 1, wherein forming the magnetic tunnel junction pillar further comprises:
    forming an MRAM stack directly above the sacrificial layer and spin-orbit torque via;
    forming a hard mask layer directly above the MRAM stack; and
    patterning the MRAM stack to form the magnetic tunnel junction pillar.

8. The method of claim 7, wherein patterning the MRAM stack to form the magnetic tunnel junction pillar further comprises:

conducting an ion beam etch, wherein back sputtering of heavy metals from the spin-orbit torque electrode and spin-orbit torque via during the etching is prevented by the sacrificial layer.

9. The method of claim 7, wherein patterning of the MRAM stack to form the magnetic tunnel junction pillar further comprises:
recessing upper portions of the sacrificial layer.

10. The method of claim 4, wherein the first conductive material, the second conductive material, and the third conductive material comprise a metal with high spin orbit coupling or metals that exhibit spin dependent scattering.

11. The method of claim 10, wherein the first conductive material, the second conductive material, and the third conductive material comprise tantalum, tungsten, platinum, and gadolinium.

12. A memory structure comprising:
a spin-orbit-torque electrode within a dielectric layer located above a substrate, the spin-orbit-torque electrode comprising a first conductive material;
a spin-orbit torque via directly above the spin-orbit-torque electrode, the spin-orbit torque via comprising a second conductive material;
a magnetic tunnel junction pillar directly above the spin-orbit torque via, the spin-orbit-torque via contacting a center of a bottom surface of the magnetic-tunnel-junction pillar; and
a third conductive material positioned directly below the bottom surface of the magnetic tunnel junction pillar on opposite sides of the spin-orbit torque via and directly above the spin-orbit-torque electrode, wherein the third conductive material, the spin-orbit torque electrode and the spin-orbit torque via comprise a bottom spin-orbit torque electrode of the magnetic tunnel junction pillar.

13. The memory structure of claim 12, wherein a length of a middle region of the bottom spin-orbit torque electrode is less than a length of a bottom region but larger than a length of a top region of the bottom spin-orbit torque electrode.

14. The memory structure of claim 12, further comprises:
sidewall spacers along opposite sides of the magnetic tunnel junction pillar and a top region of the bottom spin-orbit torque electrode.

15. The memory structure of claim 14, wherein the top region of the bottom spin-orbit torque electrode is substantially covered by the sidewall spacers.

16. The memory structure of claim 14, wherein a bottom surface of the sidewalls spacers lands on the middle region of the bottom spin-orbit torque electrode.

17. The memory structure of claim 12, further comprises:
a hard mask layer directly above the magnetic tunnel junction pillar.

18. The memory structure of claim 12, wherein the first conductive material, the second conductive material, and the third conductive material comprise a metal with high spin orbit coupling or metals that exhibit spin dependent scattering.

19. The memory structure of claim 12, wherein the first conductive material, the second conductive material, and the third conductive material comprise tantalum, tungsten, platinum, and gadolinium.

20. The memory structure of claim 13, wherein the bottom spin-orbit torque electrode comprises a stepped shape with the top region substantially matching a size of the magnetic tunnel junction pillar and the bottom region having a larger size that further improves spin-inducing capabilities.

* * * * *